United States Patent
Korneisel et al.

(10) Patent No.: US 11,749,539 B1
(45) Date of Patent: Sep. 5, 2023

(54) MASKLESS ETCHING OF ELECTRONIC SUBSTRATES VIA PRECISION DISPENSE PROCESS

(71) Applicant: Rockwell Collins, Inc., Cedar Rapids, IA (US)

(72) Inventors: Richard Korneisel, Cedar Rapids, IA (US); Nathaniel P. Wyckoff, Marion, IA (US); Brandon C. Hamilton, Marion, IA (US); Kyle B. Snyder, Marion, IA (US); Jenny Calubayan, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 126 days.

(21) Appl. No.: 17/003,667

(22) Filed: Aug. 26, 2020

(51) Int. Cl.
*H01L 21/67* (2006.01)
*H01L 21/306* (2006.01)
*H01L 21/48* (2006.01)

(52) U.S. Cl.
CPC .... *H01L 21/6708* (2013.01); *H01L 21/30604* (2013.01); *H01L 21/4803* (2013.01)

(58) Field of Classification Search
None
See application file for complete search history.

(56) References Cited

U.S. PATENT DOCUMENTS

| | | | |
|---|---|---|---|
| 7,037,854 B2 | 5/2006 | Bachrach et al. | |
| 7,572,573 B2 * | 8/2009 | Fries | G03F 7/2002 430/311 |
| 7,968,453 B2 | 6/2011 | Tanaka et al. | |
| 8,283,216 B2 | 10/2012 | Yamazaki et al. | |
| 9,289,786 B2 | 3/2016 | Bhatnagar et al. | |
| 2007/0007627 A1 * | 1/2007 | Young | H01L 21/0271 257/E21.255 |
| 2017/0309565 A1 * | 10/2017 | Ortner | H01L 23/5256 |
| 2018/0372664 A1 * | 12/2018 | Buttner | G01N 27/223 |

(Continued)

FOREIGN PATENT DOCUMENTS

| | | | |
|---|---|---|---|
| TW | I271390 B | * | 1/2007 |
| TW | 201133872 A1 | * | 10/2011 |
| TW | 201135955 A1 | * | 10/2011 |

OTHER PUBLICATIONS

Cheersonic Ultrasonics Co., Ltd., 15-25 Microns Ultrasonic Spray Nozzle for Micro Etching Glass Coating UAC55, URL: http://ultrasonicfoodcutter.sell.everychina.com/p-105625433-15-25-microns-ultrasonic-spray-nozzle-for-micro-etching-glass-coating-uac55.html. Printed Jul. 1, 2020, 1 page.

(Continued)

*Primary Examiner* — Shamim Ahmed
(74) *Attorney, Agent, or Firm* — Suiter Swantz pc llo

(57) ABSTRACT

Systems and methods for selectively etching features in an electronic substrate via a precision dispense apparatus and precision etchant dispense tool are disclosed. The method includes creating a toolpath instruction for etching at least one feature in the substrate, programming the precision dispense apparatus to execute the created toolpath instruction, and causing the precision dispense tool to deposit etchant material onto the surface of the substrate to etch the substrate surface to produce the at least one feature according to the created toolpath instruction. The capabilities of the systems and methods disclosed herein extend to 3D substrates and post-build processing, among others.

7 Claims, 4 Drawing Sheets

(56) References Cited

U.S. PATENT DOCUMENTS

2019/0024268 A1* 1/2019 Hwang ............... G03F 7/70791
2020/0192332 A1  6/2020 Jacobs et al.

OTHER PUBLICATIONS

Sonaer, Fluoropolymer Sonoalloy Atomizer Nozzle, URL: https://sonozap.com/Micro_Etching_Glass.html, Printed Jul. 1, 2020, 1 page.

* cited by examiner

MASKLESS ETCHING OF ELECTRONIC SUBSTRATES VIA PRECISION DISPENSE PROCESS

TECHNICAL FIELD

The subject matter disclosed herein is directed generally to microelectronic device fabrication and more particularly to maskless etching processes.

BACKGROUND

Etching is a controlled chemical reaction used to strip material from a substrate. Etching is a vital part of microelectronic packaging processing efforts. Often it is desirable to etch extremely small features without damaging neighboring features. Traditionally, this is accomplished using a photolithography process to mask the regions that need to be protected. However, the photolithography process is time consuming, requires a skilled handler, has significant room for failure due to alignment issues, and requires custom photomasks and photoresist material. Furthermore, the photoresist spin-on process limits photolithography to only two-dimensional (2D) surfaces and only pre-build processing.

Therefore, what is needed is a method of selectively etching features in microelectronic devices which eliminates the challenges associated with the photolithography process, and which expands selective etching capabilities to 3D substrates and post-build processing.

SUMMARY

A method for selectively etching features in a substrate via a precision dispense process and apparatus with a programmable toolpath is disclosed. In embodiments, the method includes providing an electronic substrate having a surface to be etched, providing a precision dispense apparatus having a precision dispense tool with programmable toolpath capability and precise etchant dispense volume control, creating a toolpath instruction for etching at least one feature in the surface of the electronic substrate, programming the precision dispense apparatus to execute the created toolpath instruction, and etching the at least one feature in the surface of the electronic substrate by depositing etchant material onto the surface of the electronic substrate via the precision dispense tool according to the programmed toolpath instruction.

A computer-aided system for fabricating an electronic package is also disclosed. In embodiments, the system includes a precision dispense apparatus including a precision dispense tool having programmable toolpath capability and precise etchant dispense volume control, and a toolpath creation system for creating a toolpath instruction for etching at least one feature in a surface of an electronic substrate, the toolpath instruction including a precision dispense tool movement component and an etchant dispense volume component.

The method and system embodiments according to the present disclosure provide the ability to selectively etch custom toolpaths without the need for photolithography processing and photomasks, while also providing the capability to selectively etch 3D substrates, fabricate more advanced substrate designs, post-build process microelectronic devices, and precisely control etching depth, among other abilities, capabilities and advantages.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are exemplary and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1A:
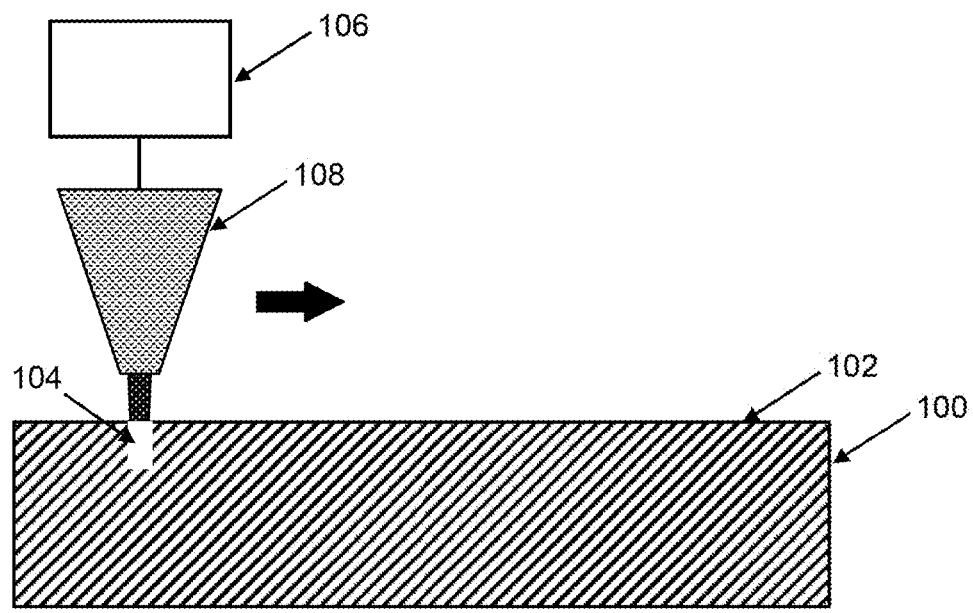
FIGS. 1A and 1B are diagrammatic cross sections illustrating a precision dispense tool depositing etchant material onto a substrate to produce an etched feature in accordance with example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

With reference to the drawing figures, the present disclosure provides systems and methods for selectively etching surface features in a substrate, for instance an electronic substrate, via a precision dispense apparatus operable for depositing etchant material onto a substrate according to a created and programmed toolpath instruction.

Figure 1B:
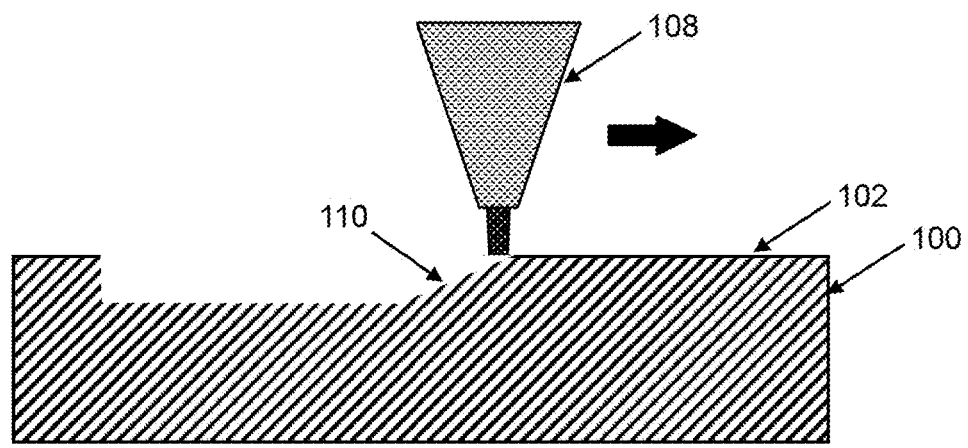

Referring to FIGS. 1A and 1B, a first step of the method includes providing a substrate 100 having a surface 102 to be etched to produce at least one etched feature 104 in the surface. In a non-limiting example, the substrate 100 may be an electronic substrate such as a microelectronic device package layer, for instance an integrated circuit (IC) package layer. In some embodiments, the substrate 100 may be an active layer of an electronic substrate upon which electronic devices are embedded and functional circuitry fabricated. In some embodiments, the substrate 100 may be fashioned of silicon or any other suitable semiconducting material. The surface 104 may be two-dimensional (2D) as shown. In other embodiments, the surface may be three-dimensional (3D) by its shape or inclusion of 3D structures as discussed further below.

A second step of the method includes providing a precision dispense apparatus 106 having precision dispense tool 108 with programmable toolpath capability and precise etchant dispense volume control. For example, the precision dispense apparatus 106 may be suitable for providing maskless deposition of aerosolized or atomized liquid-phase etchants on a nanoliter scale. The apparatus 106 may include an atomizer for atomizing liquid and particle suspensions, a precision dispense tool 108 (e.g., nozzle) directed at the substrate, a control module for automated control of process parameters, and a motion control module that drives multi-axis translation stages. In use, the precision dispense tool 108 may be translated under computer control while the substrate position remains fixed, or vice-versa. Atomized fluid materials are not limited to any one type and may be chosen based on the composition of the substrate material to be stripped, among other parameters.

Etchant volume and flowrate through the precision dispense tool 108 may be controlled via a volume control process. For example, the atomized etchant may exit the precision dispense tool 108 through an orifice directed at the substrate 100 in a stream as small as, for example, a few microns. The diameter of the dispensed stream may be controlled by the orifice size, flowrate, and spacing between the orifice and the substrate. The precision dispense tool 108 may be configured to move in different orthogonal directions parallel to or perpendicular to horizontal and under computer control via linear stages and a motion control module.

Still referring to FIGS. 1A and 1B, in use, the precision dispense tool 108 moves across the substrate 100, spaced above the surface 102, depositing etching material onto the substrate 100. The dispense volume control and tool speed may be programmed to dispense a predetermined amount of etchant material to achieve a predetermined depth, which may be uniform or vary along the length of the etched feature. For example, FIG. 1A shows an initial spot etch to a predetermined depth, while FIG. 1B shows the elongate etched feature after translation along the substrate 100, with a ramped region 110 shown to illustrate the etchant trailing behind the precision dispense tool 108 continuing to etch away substrate material until the etchant is exhausted at the predetermined etch depth.

Figure 2:
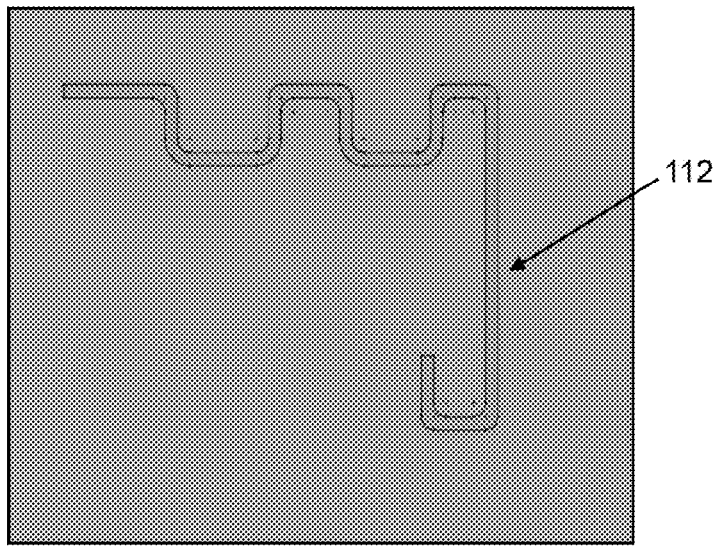
FIG. 2 illustrates a created toolpath for producing an etched feature in a substrate via a precision dispense tool in accordance with example embodiments of this disclosure.
Figure 3:
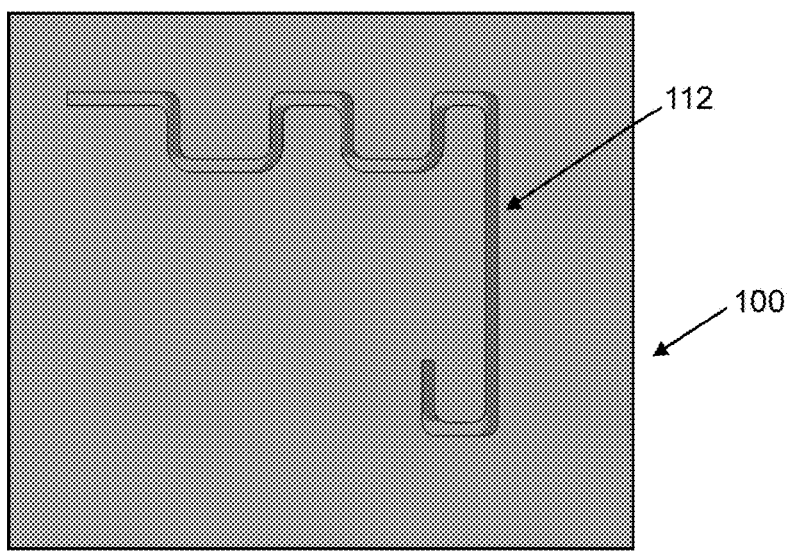
FIG. 3 is a top view of a substrate having an etched surface feature produced according to the created toolpath of FIG. 2.
Figure 4:
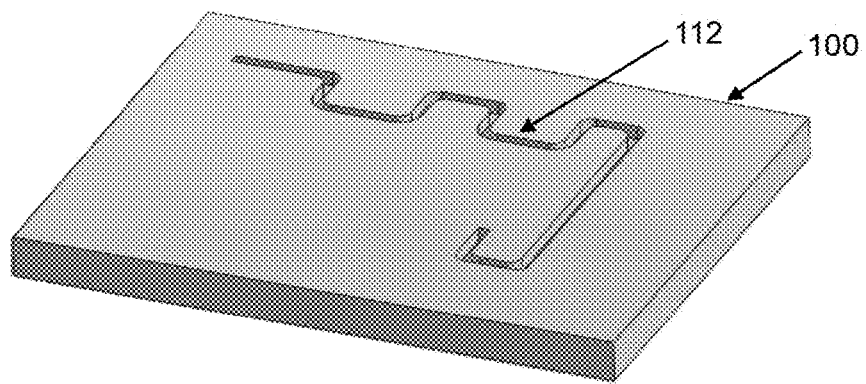
FIG. 4 is a perspective view of the substrate of FIG. 3 illustrating etched feature depth.

Referring to FIG. 2, a third step of the method includes creating a toolpath instruction for etching a feature 112 in a substrate. For example, the toolpath shown is a continuous, non-linear feature having a uniform etch depth. In a fourth step of the method, the precision dispense apparatus is programmed to execute the created toolpath instruction, which may include both precision dispense tool movement control and precision dispense volume control. Referring to FIGS. 3 and 4, in a fifth step of the method the precision dispense apparatus operates to move the precision dispense tool and etchant flow volume to etch the feature 112 according to the programmed toolpath and flowrate instructions.

Known to those skilled in the art of computer numerical control (CNC), the precision dispense apparatus may operate to automate the control of the precision dispense tool via a computer to meet the specifications of the coded instructions of the toolpath without a manual operator. The created toolpath instructions may be delivered to the precision dispense apparatus in the form of a sequential program of machine control instructions such as G-code generated by computer-aided design (CAD) software.

Controls including, but not limited to, etchant flowrate, precision dispense tool velocity, and precision dispense tool spacing above the substrate may be based on at least one predetermined parameter corresponding to at least one of the etchant material, electronic substrate material, and desired etch depth(s).

Figure 5:
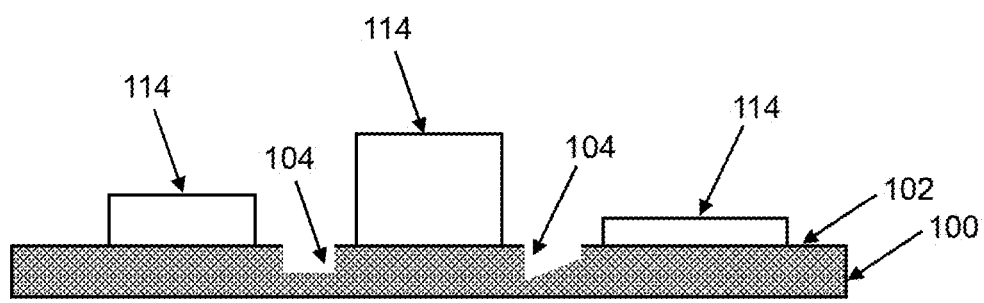
FIG. 5 is a diagrammatic cross section of a substrate having three-dimensional (3D) surface features and etched surface features etched according to the methods of the present disclosure.
Figure 6:
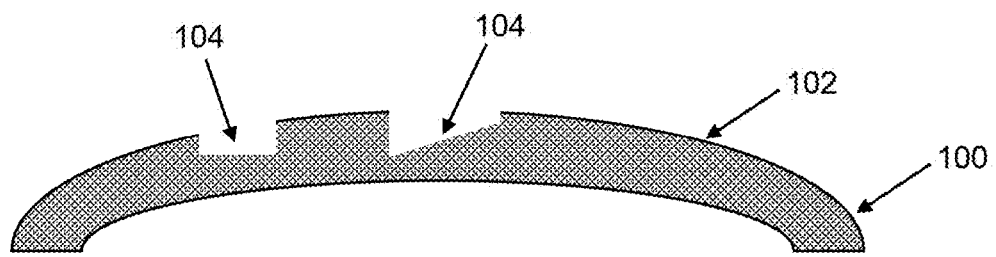
FIG. 6 is a perspective view of a curved substrate having etched surface features etched according to the methods of the present disclosure.

Referring to FIGS. 5 and 6, capabilities of the systems and methods of the present disclosure extend to three-dimensional (3D) substrates and/or post-build processing. For example, FIG. 5 shows the surface 102 of the substrate 100 including a plurality of 3D features, for instance embedded devices 114, with features 104 etched between the devices 114 subsequent to device embedding, while FIG. 6 shows a curved substrate surface 102 having etched features 104. Additional capabilities of the systems and methods disclosed herein include the ability to alter the toolpath in real-time to accommodate design changes, the ability to "touch-up' fabricated substrates, and the ability to vary etch depth along the length of a feature. Furthermore, the methods disclosed herein may be practiced in conjunction with conventional masking processes, for example, to etch respective lower and higher resolution areas of a substrate to provide a hybrid etching approach.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. A method for maskless substrate etching, comprising:
    providing a substrate having a surface to be etched, the substrate including at least one embedded electronic device protruding from the surface of the substrate, and the surface of the substrate being free of mask material;
    providing a precision dispense apparatus including a precision dispense tool with programmable toolpath capability and precise etchant dispense volume control;
    creating a toolpath instruction for etching at least one feature in the surface of the substrate proximate to the at least one embedded electronic device;
    programming the precision dispense apparatus to execute the created toolpath instruction; and
    causing the precision dispense tool to deposit etchant material directly onto the surface of the substrate, only at a location or locations on the surface of the substrate to be etched proximate to the at least one embedded electronic device, to etch the substrate surface to produce the at least one feature according to the created toolpath instruction.

2. The method according to claim 1, wherein the created toolpath instruction comprises:
    a movement component for controlling movement of the precision dispense tool along at least two different orthogonal directions; and
    a volume control component for controlling a volume and flowrate of etchant dispensed by the precision dispense tool.

3. The method according to claim 2, wherein the volume and flowrate of etchant dispensed by the precision dispense tool is based on at least one predetermined parameter corresponding to at least one of the etchant material, the substrate material, and movement velocity of the precision dispense tool.

4. The method according to claim 1, wherein the etchant is atomized.

5. The method according to claim 1, wherein the substrate is an electronic substrate.

6. The method according to claim 1, wherein the surface of the substrate is curved.

7. The method according to claim 1, wherein the at least one feature to be etched according to the created toolpath instruction has a non-uniform depth.

* * * * *